United States Patent
Pappas et al.

(10) Patent No.: US 10,512,327 B2
(45) Date of Patent: Dec. 24, 2019

(54) FURNITURE WITH PIVOTABLE ELECTRONICS RACK

(71) Applicant: Middle Atlantic Products, Inc., Fairfield, NJ (US)

(72) Inventors: Andreas Pappas, Butler, NJ (US); Dean Wheelan, Pompton Lakes, NJ (US)

(73) Assignee: Legrand AV Inc., Fairfield, NJ (US)

( * ) Notice: Subject to any disclaimer, the term of this patent is extended or adjusted under 35 U.S.C. 154(b) by 0 days.

(21) Appl. No.: 15/971,736

(22) Filed: May 4, 2018

(65) Prior Publication Data

US 2018/0332962 A1    Nov. 22, 2018

Related U.S. Application Data

(60) Provisional application No. 62/509,516, filed on May 22, 2017.

(51) Int. Cl.
| | |
|---|---|
| A47B 83/00 | (2006.01) |
| H05K 7/18 | (2006.01) |
| H05K 7/14 | (2006.01) |
| H05K 7/16 | (2006.01) |
| H05K 7/20 | (2006.01) |
| A47B 23/06 | (2006.01) |
| A47B 45/00 | (2006.01) |
| A47B 96/16 | (2006.01) |
| A47B 46/00 | (2006.01) |
| A47B 21/03 | (2006.01) |

(52) U.S. Cl.
CPC ............ *A47B 83/001* (2013.01); *A47B 23/06* (2013.01); *A47B 45/00* (2013.01); *A47B 46/00* (2013.01); *A47B 96/16* (2013.01); *H05K 7/1401* (2013.01); *H05K 7/16* (2013.01); *H05K 7/18* (2013.01); *H05K 7/20172* (2013.01); *A47B 2021/0335* (2013.01); *A47B 2200/0068* (2013.01); *A47B 2200/0069* (2013.01); *A47B 2200/0079* (2013.01)

(58) Field of Classification Search
CPC ....... A47B 83/001; A47B 96/16; A47B 45/00; A47B 46/00; A47B 21/007; A47B 2021/0076; A47B 21/02; A47B 21/03; A47B 2021/0335; H05K 7/16; H05K 7/18
USPC ...................................................... 312/223.3
See application file for complete search history.

(56) References Cited

U.S. PATENT DOCUMENTS

| | | | | |
|---|---|---|---|---|
| 5,558,418 | A * | 9/1996 | Lambright | A47B 21/00 312/321.5 |
| 6,126,253 | A * | 10/2000 | Kelley | A47B 17/006 312/195 |
| 7,439,694 | B2 * | 10/2008 | Atlas | A47B 9/04 108/146 |
| 7,874,538 | B2 | 1/2011 | Atlas et al. | |
| 8,084,992 | B2 * | 12/2011 | Scheffy | B25H 3/02 312/223.1 |

(Continued)

*Primary Examiner* — Nidhi Thaker
(74) *Attorney, Agent, or Firm* — Drinker Biddle & Reath LLP

(57) ABSTRACT

A pedestal for a conference table or other furniture has a shell having an opening, and a rack for electronic equipment mounted within the opening. The rack is pivotable about a vertical axis between a stowed position in which the rack is entirely within the pedestal and an access position in which the rack is largely outside the pedestal.

19 Claims, 9 Drawing Sheets

(56) References Cited

U.S. PATENT DOCUMENTS

| | | | |
|---|---|---|---|
| 2008/0265724 A1* | 10/2008 | Robins | A47B 21/00 312/223.3 |
| 2010/0288168 A1* | 11/2010 | Rheault | A47B 13/10 108/28 |
| 2017/0251806 A1* | 9/2017 | Newman | A47B 21/02 |
| 2018/0332956 A1* | 11/2018 | Pappas | A47B 21/04 |

* cited by examiner

FURNITURE WITH PIVOTABLE ELECTRONICS RACK

RELATED APPLICATION

This application is related to and claims priority from U.S. Provisional Patent Application 62/509,516, filed May 22, 2017, the disclosure of which is incorporated herein by reference in its entirety.

FIELD OF THE INVENTION

The invention relates to an electronics rack and, more particularly, to the pivotable mounting of an electronics rack in a piece of furniture, such as in a pedestal under, for example, a large conference room table or counter.

BACKGROUND

It is well known for a large table, such as a conference room table or a counter to be supported by one or more pedestals, which may contain storage space. It has recently become common for conference tables to be provided with outlets for electrical power and electronic data, and interfaces for audio-visual equipment, to be provided in the top surface of a conference table, and for wired connections to such outlets to be fed up and down through a pedestal supporting the table. That arrangement has an advantage aesthetically in that the wiring and any stored equipment are hidden from view, and functionally that the wiring and equipment are protected from the feet of users of the room, and the users are protected from bumping into the equipment or being tripped by the wiring.

However, with conventional pedestals, access to equipment within the pedestal can be difficult, especially when the pedestal is under a large tabletop that overhangs in all directions.

There is therefore a need for a pedestal with better access to internally mounted electronics.

SUMMARY

In one aspect, there is provided a pedestal for furniture that includes a structural enclosure with an interior and an opening for accessing the interior, the enclosure including a base, sidewalls and a horizontal partition spaced upward from the base. A rack for electronic equipment is located within the interior of the enclosure. The rack is mounted to at least the base so as to be pivotable about a vertical axis between a stowed position in which the rack is entirely within the interior of the enclosure and an access position in which the rack is largely outside the enclosure.

In various embodiments, the rack includes a top panel, a bottom panel and vertical supports that are attached to and connect the top and bottom panels.

The vertical supports may be mounting plates that include a plurality of apertures for use in securing brackets, wiring and electronics to the rack. The apertures may be configured to interconnect with a tool-less locking mechanism for removable securing components to the mounting plates.

In various embodiments the pivotable mounting may include an upper pin mounted to the top panel or an upper end of one of the vertical supports of the rack proximate to a corner of the rack and extends upward from the rack, and a lower pin attached to the bottom panel or a lower end of one of the vertical supports of the rack vertically aligned with the upper pin but extending downward from the rack. The pins engage with corresponding holes preferably in the base and the partition, the pins permitting the rack to be pivoted between the stowed position and the access position.

The upper and lower pins are preferably spring pins which permit each pin to be retracted to release the pin from its corresponding hole or detent, thereby permitting removal of the rack.

In an embodiment the pedestal includes a locking mechanism for securing the rack to the pedestal in its stowed position. The locking mechanism may include a detent pin located at or near a front corner of the rack located away from the pivot pins, the detent pin engaging with a detent recess in the base to hold the rack in the stowed position. The detent pin may include a spring for biasing the spring into engagement with the detent in an engaged position. In an embodiment the detent pin is lockable in its engaged position.

In various embodiments, the enclosure may include two telescoping slide mechanisms, one attached to a top of the base and the other attached to a bottom of the partition. Each telescoping slide mechanism includes a fixed base bracket and a movable bracket that slides on the base bracket. The pivotable mounting preferably includes an upper pin mounted to the top panel or an upper end of one of the vertical supports of the rack proximate to a corner of the rack and extends upward from the rack, and a lower pin attached to the bottom panel or a lower end of one of the vertical supports of the rack vertically aligned with the upper pin but extending downward from the rack. Each pin is removably engaged with a hole in a corresponding movable bracket of the slide mechanism. The slide mechanisms telescope so as to permit the rack to slide at least partially out of the interior of the enclosure and the pins permit the rack to be pivoted about the vertical axis to the access position.

In various embodiments cable management brackets may be mounted to the sidewall of the enclosure.

The partition may include one or more openings with one or more cooling fans mounted to the openings and configured to draw air out of or force air into the interior.

It is contemplated that a space above the partition may contain a receptacle with at least one of power and data outlets, accessible from above the pedestal.

In an embodiment, the pedestal enclosure is telescopically adjustable in at least one horizontal dimension.

In an embodiment, the base includes a rack support frame located between the rack and the partition. The support frame is attached to the sidewalls and includes two lateral frame members and a center frame member. Each lateral frame member includes a side panel, a back panel, a bottom panel and a front bracket which are affixed to one another. Each side panel has a top leg and a bottom leg, with the top legs of the side panels are attached to a bottom surface of the partition. The center frame member includes a back panel, a bottom panel, a lower crossbar, and an upper crossbar. Portions of the back and bottom panels of the lateral frame members preferably slide behind and under, respectively, portions of the back and bottom panels of the center frame member, thus allowing for the lateral frame members to translate relative to the center frame member. The lateral front brackets of the lateral frame members preferably include an internal cavity into which the lower crossbar slides so as to permit lateral movement of the lateral frame members.

In an embodiment, the pivotable mounting includes an upper pin mounted to the top panel or an upper end of one of the vertical supports of the rack proximate to a corner of the rack and extends upward from the rack, and a lower pin attached to the bottom panel or a lower end of one of the vertical supports of the rack vertically aligned with the upper pin but extending downward from the rack. The pins engage with corresponding holes in the lower and upper crossbars, wherein the pins permit the rack to be pivoted between the stowed position and the access position.

In an embodiment, a table is disclosed that includes a top supported in whole or in part by a pedestal according to any of the embodiments.

A receptacle for at least one of power and data outlets may be located in the table and has in its top a door flush with the table top.

The foregoing and other features of the invention and advantages of the present invention will become more apparent in light of the following detailed description of the preferred embodiments, as illustrated in the accompanying figures. As will be realized, the invention is capable of modifications in various respects, all without departing from the invention. Accordingly, the drawings and the description are to be regarded as illustrative in nature, and not as restrictive.

BRIEF DESCRIPTION OF THE DRAWINGS

While the following discussion addresses an implementation of the invention in a conference room table, the invention can be implemented into the pedestal for any type furniture, and could also be incorporated into credenzas and cabinets that do not have a pedestal. For the purpose of illustrating the invention, the drawings show a form of the invention which is presently preferred. However, it should be understood that this invention is not limited to the precise arrangements and instrumentalities shown in the drawings.

DETAILED DESCRIPTION

Figure 1:
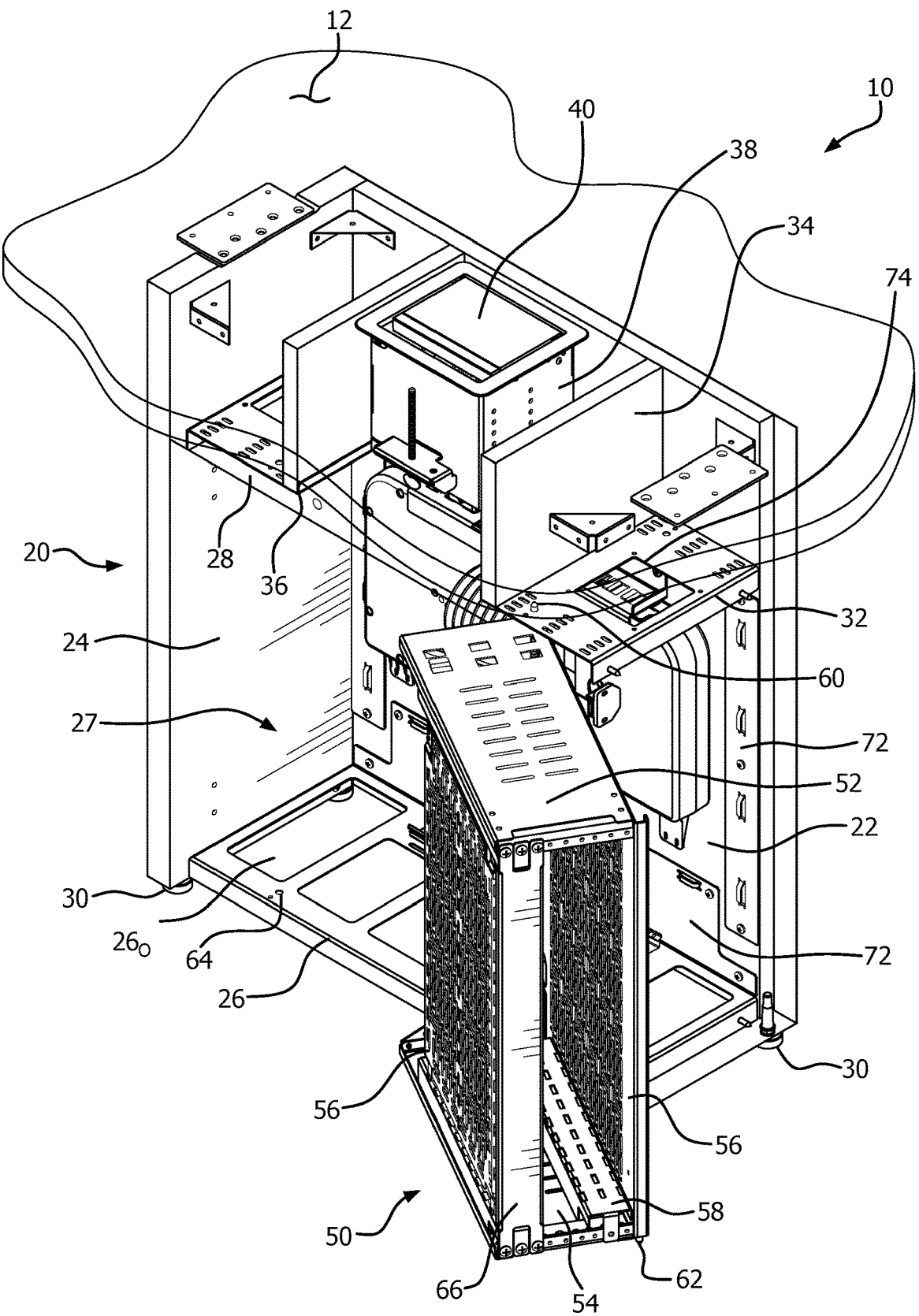
FIG. 1 is a perspective view of a pedestal with an electronics rack pivotally mounted to the pedestal according to an embodiment of the invention with the rack shown in its accessible position.

Referring to the drawings, and initially to FIG. 1, a table indicated generally by the reference numeral 10 comprises a top 12 and a pedestal indicated generally by the reference numeral 20. The table top 12, which is shown partially cut away and partially ghosted, may be conventional. A small table top 12 may be supported on a single pedestal 20 under the middle of the table top. A larger table top 12 may be supported in part by the pedestal 20, and in part by one or more other pedestals (not shown) which may be the same as or different from pedestal 20, or by some other support, such as a wall or another piece of furniture.

Pedestal 20 is preferably generally rectangular in cross-section, and comprises a back wall 22, two side walls 24, one of which has been omitted for clarity, a base 26, and a horizontal partition 28. A front side of the pedestal 20 is open, and may be provided with a door or a removable cover, not shown. While a rectangular pedestal is shown in the drawings, the present invention is not limited to any particular shape. Thus, for example, the invention described herein can be applicable to pedestal having curved surfaces.

The back wall 22 and side walls 24 are preferably solid, except where openings are needed for specific purposes, in order to protect equipment inside the pedestal 20 and people outside the pedestal from each other. The base 26 may be solid, or may be an open framework as shown in FIG. 1 with one or more openings $26_O$. The back wall, side walls and base define an internal cavity 27 within the pedestal 20.

Feet 30 may be provided at the corners of the pedestal 20, and may be adjustable in a conventional way to accommodate any slight unevenness of a ground surface on which the table 10 is standing.

Figure 2:
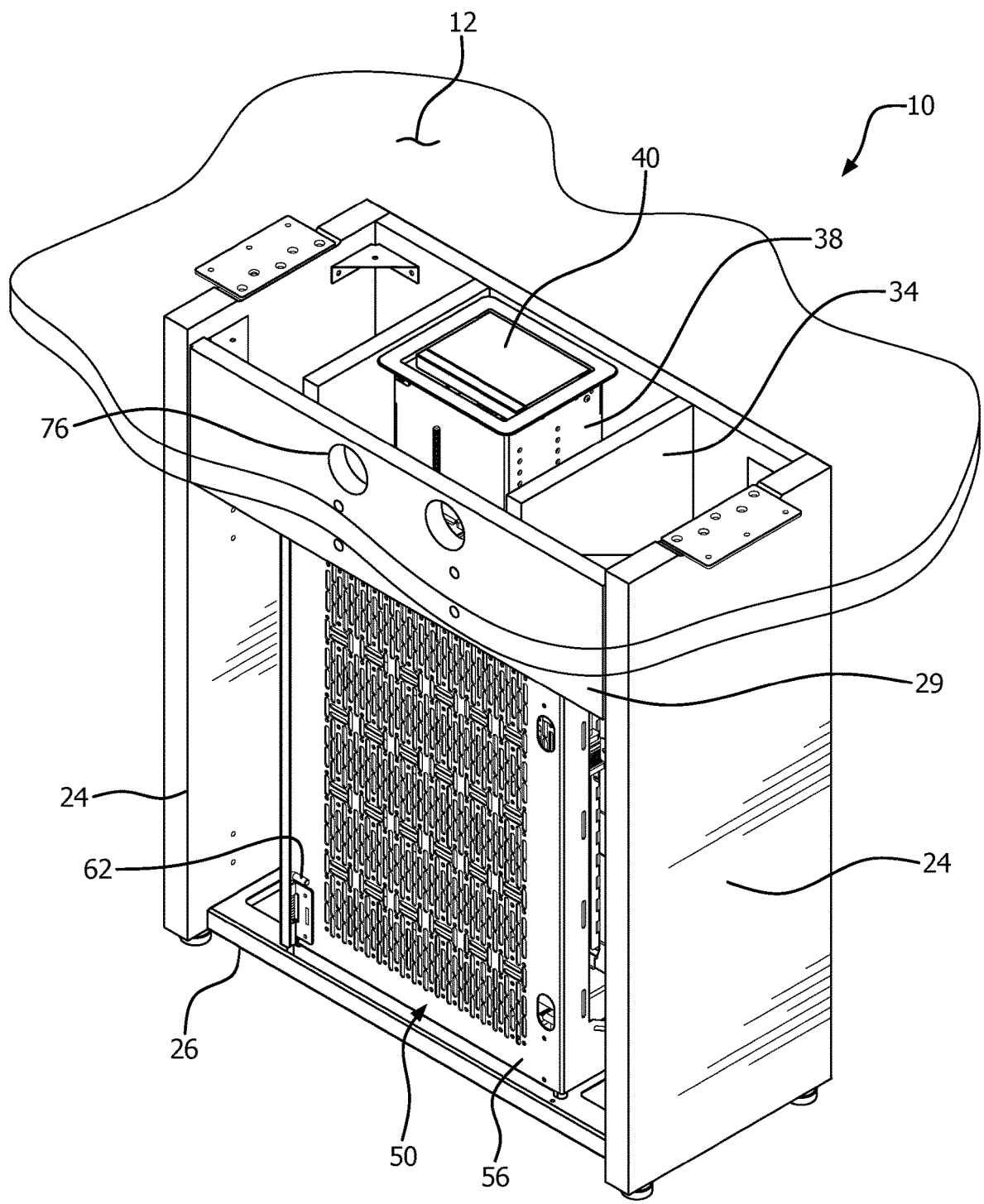
FIG. 2 is a perspective view of the pedestal of FIG. 1 with the electronics rack shown in its stowed position.

As shown in FIG. 1, the partition 28 is located below the top of the pedestal and includes two end sections 32 that are each adjacent and mounted to a respective side wall 24, and may be attached to the back wall to provide additional support. As shown in FIG. 2, the partition 28 may also include a front partition wall 29. There is an opening, preferably in the center between the end sections for cabling. Vertical walls 34 preferably are attached to and extend upward from the inner edges 36 of the partition end sections 32 toward the underside of the table top 12. A table box 38 is located between the vertical walls 34. The top of the table box 38 is flush with the table top 12 and has a lid 40 that can be opened to provide user access to power and data outlets within the box 38. The table box 38 may be mounted to the pedestal or mounted to the table top 12.

A rack for electronic units, such as audio/video, telecommunication and computer components, is generally indicated by the reference numeral 50. The rack 50 is located between the base 26 and the partition 28. The rack 50 is generally cuboidal in shape and, in one embodiment, includes a top 52, a bottom 54 and vertical supports 56 that are attached to and connect the top and bottom. In the illustrated embodiment (best seen in FIGS. 2 and 3), the vertical supports are mounting plates or panels that include a plurality of apertures for use in securing brackets, wiring and electronics to the rack 50. The apertures are preferably arranged to interconnect with a Lever Lock® locking mechanism for removable securing components. The Lever Lock® locking mechanism is described in U.S. Pat. No. 9,131,622, the disclosure of which is incorporated herein by reference in its entirety. The use of mounting panels that are easily removable, such as without tools, is beneficial in the present invention since the rack 50 may be located in tight areas under the table top. The removable panels allow a service technician to quickly remove and replace panels without the need for removing the entire rack. The tool-less mounting mechanism, such as the Lever Lock® locking mechanism, facilitates that removal and replacement. The rack 50 includes a space between the vertical supports 56 within which electronic components may be mounted. Mounting brackets 58 may be secured to the rack that also include apertures for interconnecting with a Lever Lock® locking mechanism.

The rack 50 is preferably pivotally attached to the pedestal at one corner by pins 60. One pin 60 is mounted to the top 52 or the vertical support 56 of the rack and extends upward, and a second pin 60 is attached to the bottom 54 or the vertical support 56 of the rack and extends downward. The pins 60 engage with corresponding holes in the base 26 and the partition 28. Preferably the pins 60 are spring-loaded so as to permit the pins to be retracted to release them from the holes, thereby permitting removal of the rack 50. The removability of the rack 50 allows a service technician to quickly remove a rack and transport the rack to a location where the electronics can be serviced without the need to adversely disrupt usage of the table. The pins 60 permit the rack 50 to be pivoted between a stowed position (shown in FIGS. 2 and 3) and an access position (shown in FIG. 1). In the stowed position, the rack 50 is located within the internal cavity 27 with the sides 56 of the rack 50 generally parallel to the back wall 22 of the pedestal and the front opening, with the outward facing side 56 of the rack 50 positioned just inside the front edges of the pedestal sides 24, so that the door or access panel can be closed. In the access position, substantially all of the rack 50, except for the corner with the pins 60, is pivoted outside of the internal cavity 27.

While the above embodiment described the rack 50 pivotally attached to the pedestal, it is also contemplated that a slide mechanism could be inserted between the pedestal and the rack so as to permit the rack to be slid outwards from the cavity and then pivoted. In such an embodiment, the slide mechanism would include fixed base brackets mounted to the base 26 and the partition 28. Movable brackets that slide on the base brackets would be attached to the top 52 and bottom 54 of the rack 50. The pins 60 of the rack 50 would engage holes in the movable brackets. This embodiment would provide the service technician with further access to the rack 50.

The rack 50 preferably includes a locking mechanism for securing the rack 50 to the pedestal in its stowed position. In one embodiment, the locking mechanism is a detent pin 62 located at or near the front corner of the rack located away from the pivot pins 60. The detent pin 62 engages with a detent recess 64 in the base 26 to hold the rack 50 in the stowed position. The detent pin 62 may be spring loaded, or manually releasable. The detent pin 62 may be lockable in its engaged position, thereby locking the rack 50 in the stowed position. That is especially advantageous to prevent removal of any electrical or electronic equipment on the rack when in its stowed position. It should be readily apparent that the detent pin 62 could be on the top 52 of the rack and the detent recess 64 in the partition 28. Also, the locations of the detent pin 62 and detent recess 64 could be reversed. Other locking mechanisms could be used, such as a conventional key lock.

The rack 50 may have other measures to prevent or inhibit the unauthorized removal of equipment or to conceal the components, for example, a panel 66 may be incorporated into the rack so as to obstruct access to pieces of equipment.

Figure 4:
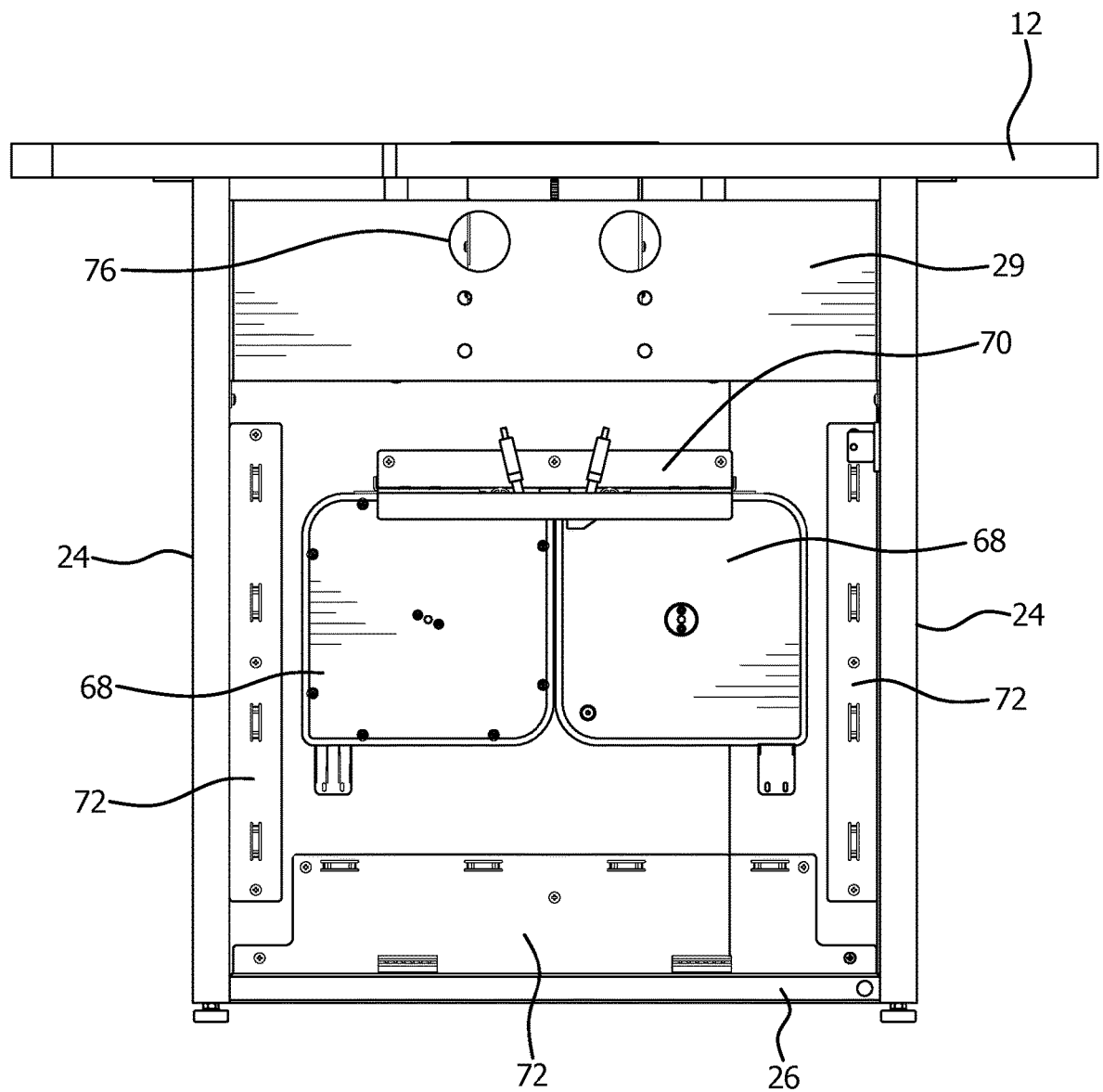
FIG. 4 is a front view of the pedestal of FIG. 1 with the electronics rack removed.

The width of the rack 50 is preferably less than the depth of the internal cavity 27 so that additional components can be mounted within the pedestal. For example, as show in FIG. 4, one or more conventional cable retractors 68 may be mounted to the interior surface of the back wall 22, preferably below the table box 36. The mounting of the cable retractors may be through one or more mounting brackets 70 that are secured to the back wall 22. In the illustrated embodiment, the mounting brackets 70 include openings for the cabling to pass through. A power strip (not shown), may also be mounted to the back wall 22, side wall 24 or base 26 so as to provide readily accessible power for the electronics on the rack 50. As may be seen from FIG. 1, cabling between the table box 36 and the rack 50 can easily be led through the open center of the partition 28.

In order to prevent pinching, kinking, or tugging on electrical and electronic cables and connections when the rack 50 is pivoted between its stowed and access positions, the cables are preferably led in and out of the rack 50 near the corner with the hinges 52. Suitable supports and guides such as cable management brackets 72 are mounted to the pedestal. As shown in the figures, the cable management brackets 72 are preferably mounted to the back wall 22 or side walls 24 so that the cabling from the table box 36 can be routed away from the rack 50 to prevent kinking or pinching when the rack 50 is swung in and out.

Figure 3:
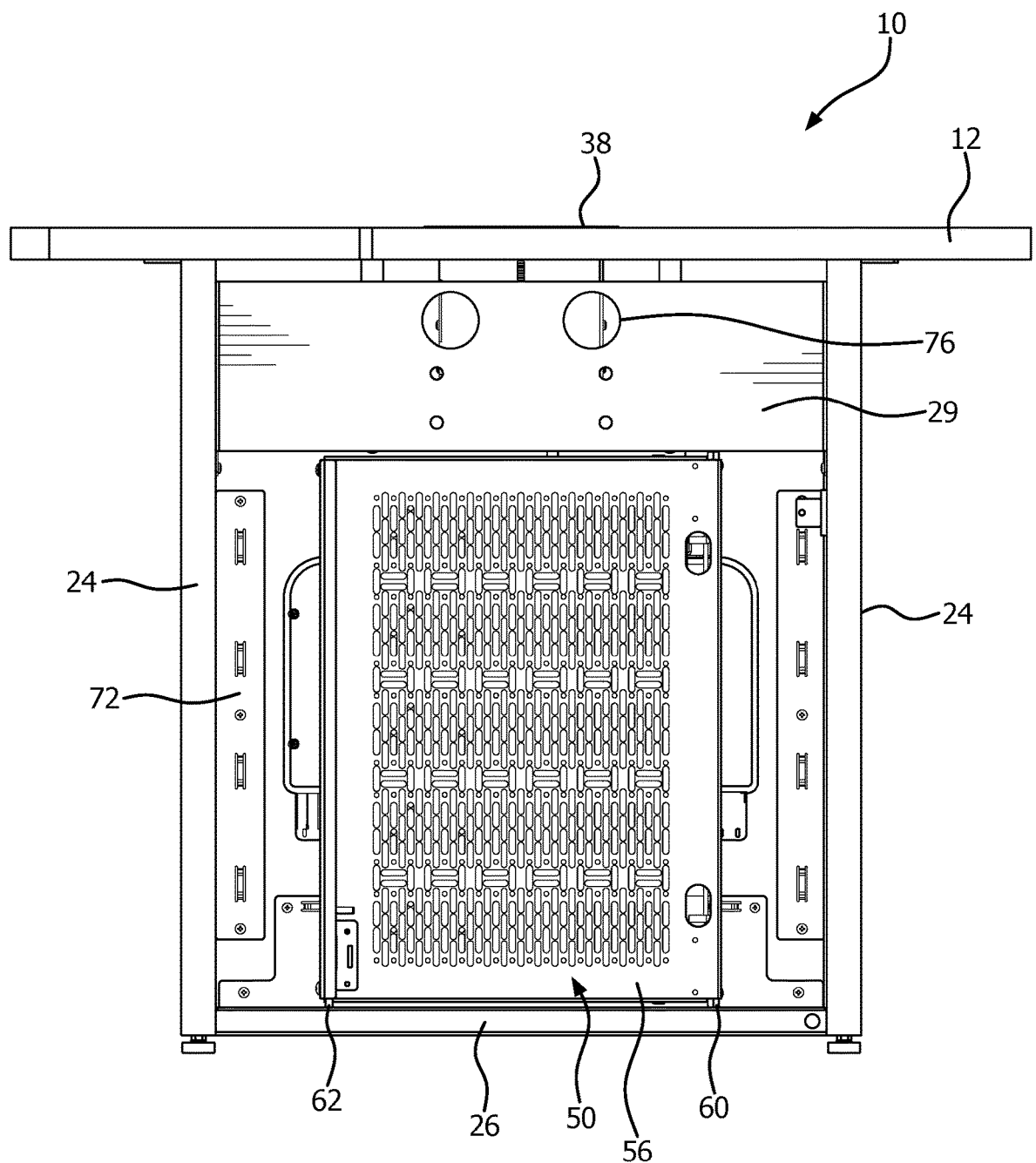
FIG. 3 is a front view of the pedestal of FIG. 1 with the stowed electronics rack.

In order to draw or force heat that is generated from the electronics away from the rack, one or more cooling fans (not show) are preferably incorporated into the pedestal. In one embodiment, the partition 28 has one or more openings 74 in one or more of the end sections 32. A cooling fan is mounted to the opening to draw air out of or force air into the interior cavity 27. If the fan is configured to force air into the cavity 27, then the base 26 preferably includes openings $26_O$. Alternatively, the fans can be configured to draw air upward out of the interior cavity. In this embodiment, there are preferably vent holes 76 in the front partition wall 29 (as shown in FIGS. 2 and 3), back wall 22 or side walls 26 so as to channel the heated air below the table top 12.

Figure 5:
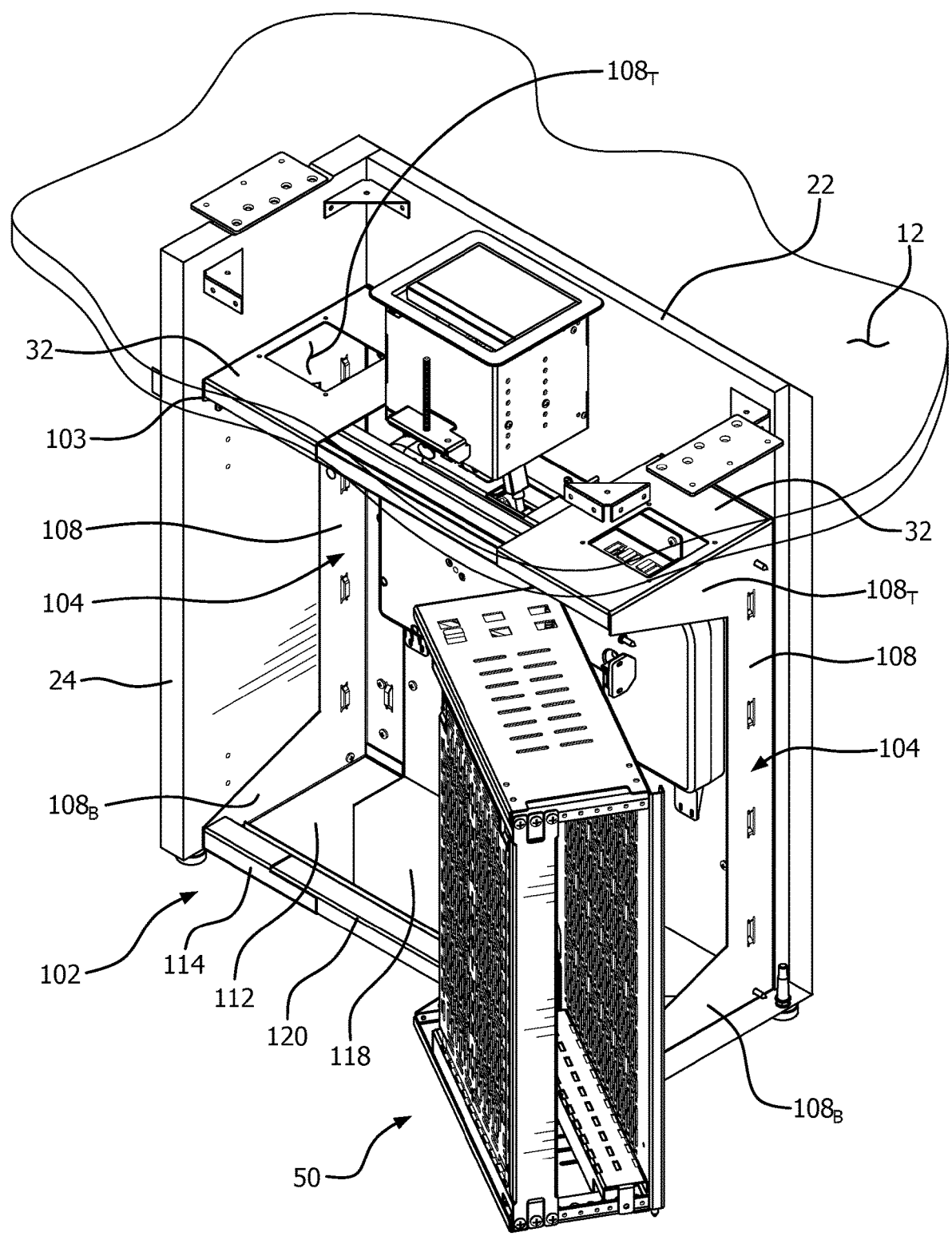
FIG. 5 is a perspective view of a pedestal with an adjustable electronics rack assembly pivotally mounted to the pedestal according to another embodiment of the invention with the rack shown in its accessible position.
Figure 6:
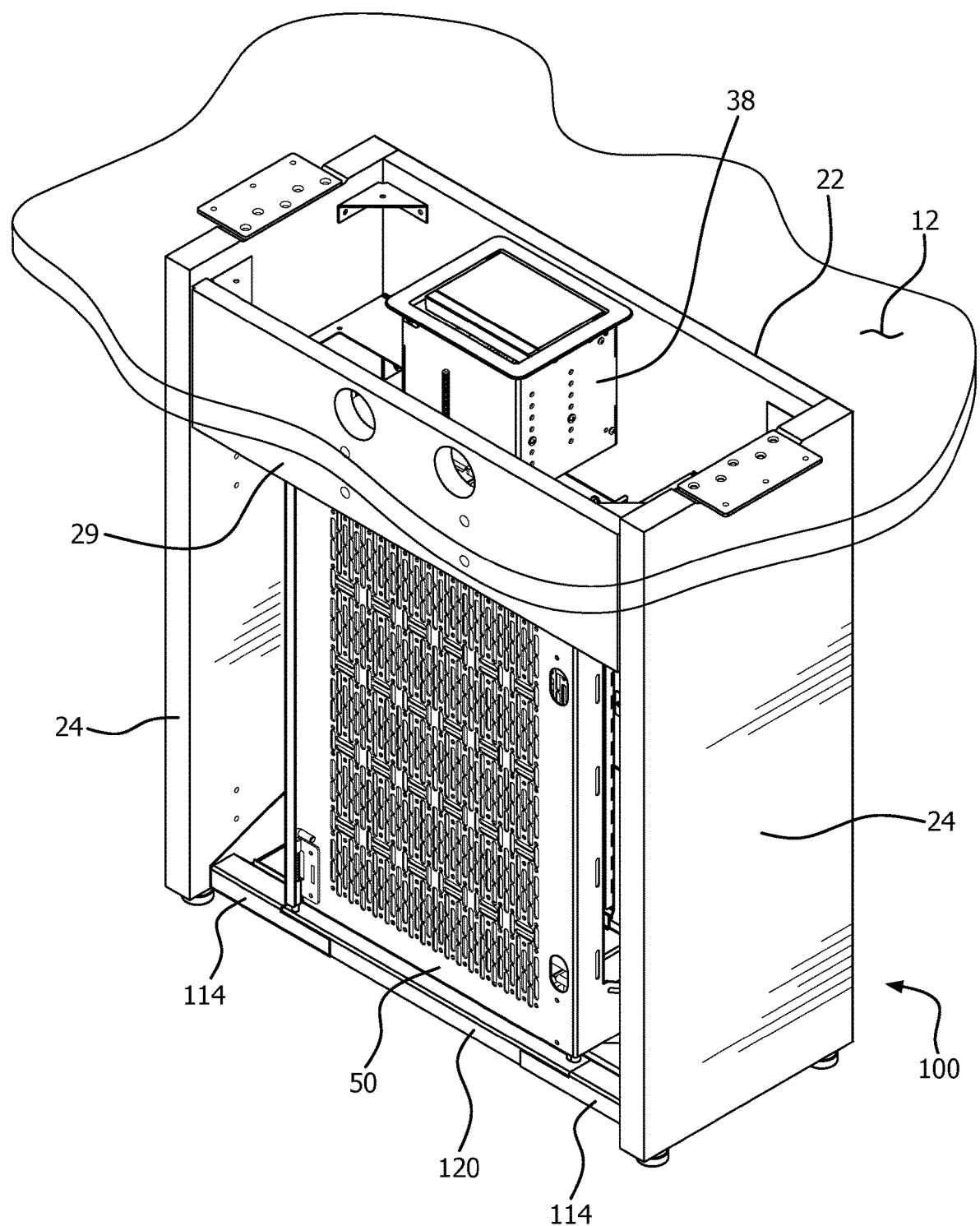
FIG. 6 is a perspective view of the pedestal of FIG. 5 with the electronics rack shown in its stowed position.
Figure 7:
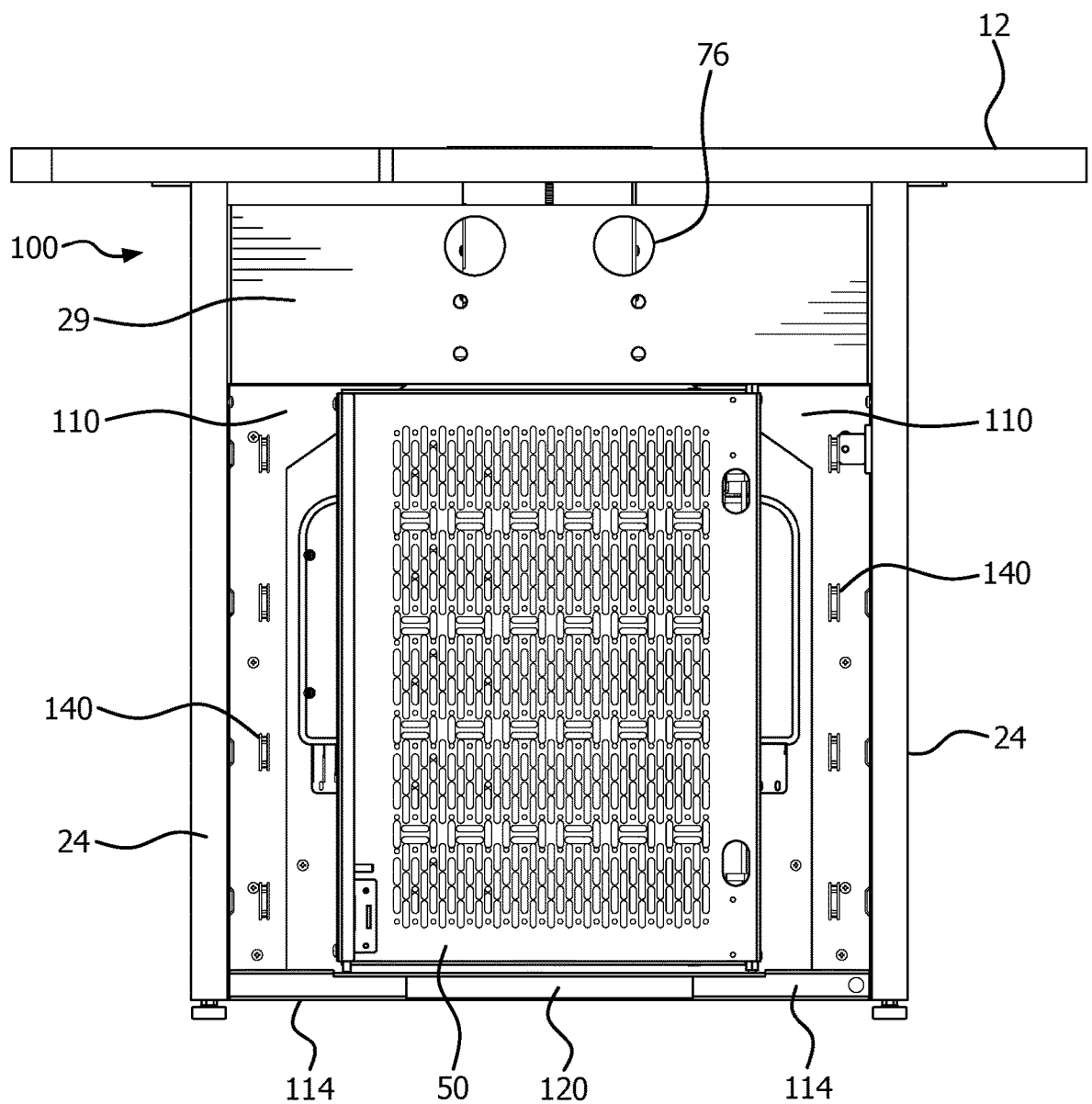
FIG. 7 is a front view of the pedestal of FIG. 5 with the stowed electronics rack.
Figure 8:
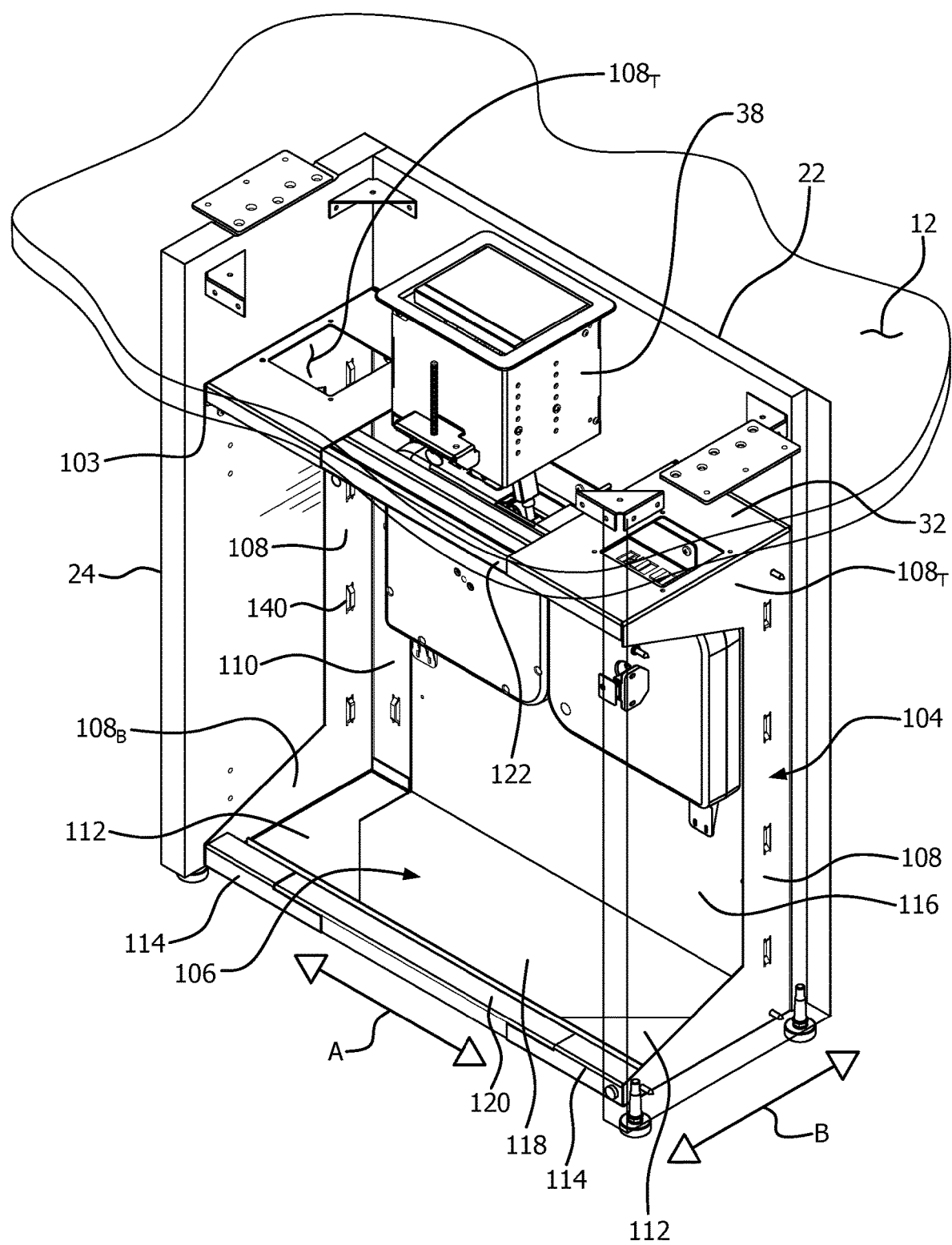
FIG. 8 is a perspective view of the pedestal of FIG. 5 with the electronics rack removed.
Figure 9:
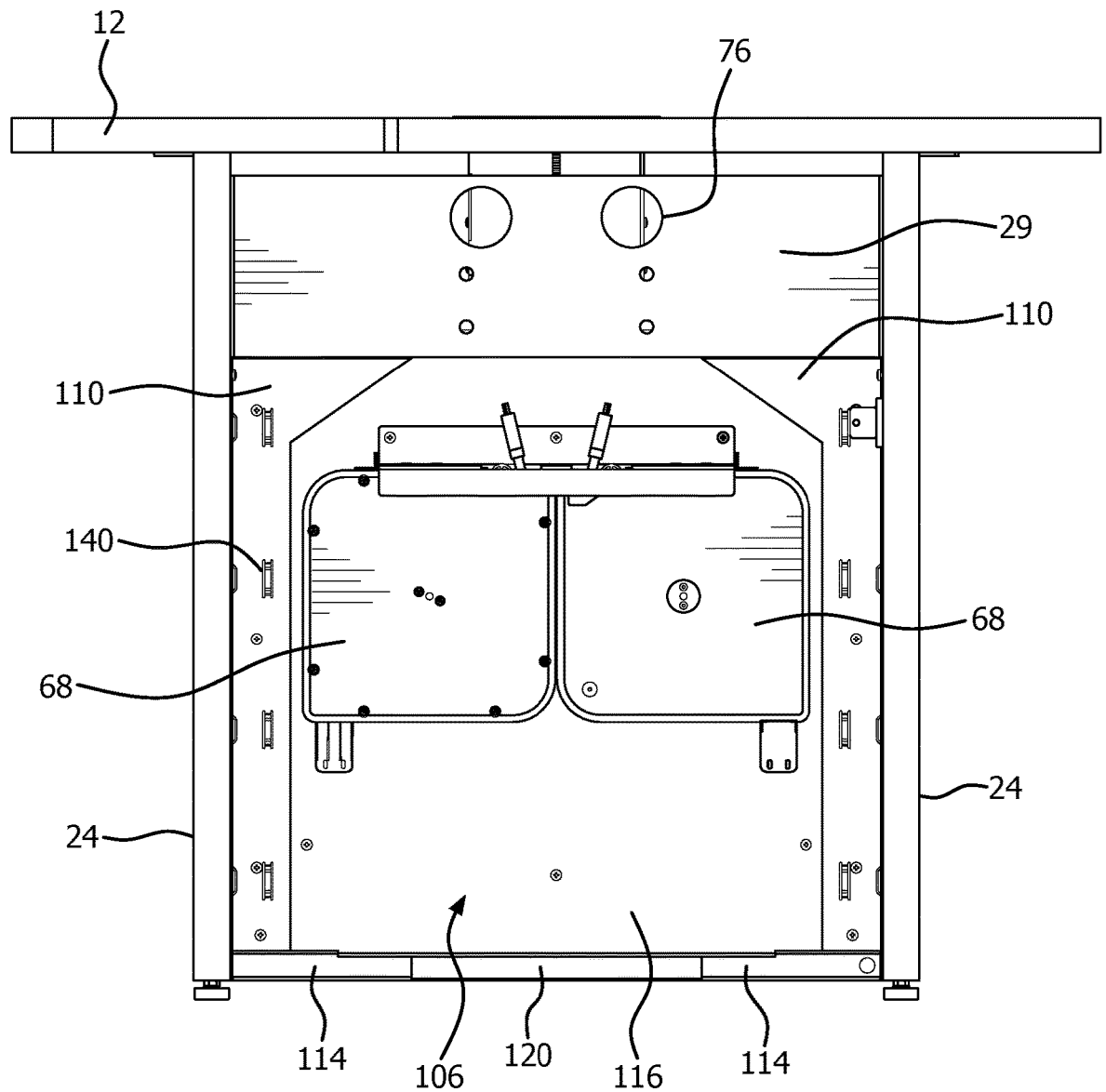
FIG. 9 is a front view of the pedestal of FIG. 1 with the electronics rack removed.

Referring now to FIG. 5, a second embodiment of a pedestal 100 is shown which is substantially the same as pedestal 20, and in the interest of conciseness the description is not unnecessarily repeated. In this embodiment, the pedestal is essentially the same. However, the rack support frame 102 is constructed so as to provide adjustment in the width direction (designated by the arrows marked "A" in FIG. 8), and the depth direction (designated by the arrows marked "B" in FIG. 8). The rack support frame 102 is mounted in the interior cavity 27 and is an intermediate component between the rack 50 and the partition 28. The support frame 102 is preferably affixed to one or more of the inside walls of the pedestal 100. The support frame 102 includes two lateral frame members 104 and a center frame member 106. Each lateral frame member 103 includes a side panel 108, a back panel 110, a bottom panel 112 and a front bracket 114 that are affixed to one another. Each side panel 108 has a top leg $108_T$ and a bottom leg $108_B$. The lateral edge 104 of each of the end sections 32 of the partition 28 are attached to a respective one of the top legs $108_T$ of the side panels 108. The center frame member 106 include a back panel 116, a bottom panel 118, a lower crossbar 120, and an upper crossbar 122. As shown, portions of the back and bottom panels 110, 112 of the lateral frame members 104 slide behind and under, respectively, the portions of the back and bottom panels 116, 118 of the center frame member 106, thus allowing for the lateral frame members to telescope or translate relative to the center frame member in the direction A. The lateral front brackets 114 of the lateral frame members 104 include an internal cavity into which the lower crossbar 120 slides. The upper crossbar 122 is similar in construction to the lower crossbar 120 and slides within upper brackets of the end sections 32 so as to permit lateral movement of the lateral frame members 104 and end sections 32 toward and away from one another. The upper crossbar 122 is preferably attached to the center frame member through brackets (not shown). Although not shown in the figures, the adjustability of the depth of the rack support frame 102 in the B direction can be achieved through use of similar telescoping components. This embodiment permits the rack support frame 102 to be adjusted to fit the interior of the pedestal. Once the desired width and depth is achieved, screws can be used to lock the telescoping components.

As should be apparent, the arrangement of the lateral frame members 104 and center frame member 106 are configured such that each lateral frame member 104 is independently slidable laterally relative to the center frame member 106.

The equipment rack 50 in the embodiment of FIG. 5 may be identical to the rack 50 shown in FIG. 1, and is pivotally attached to the lower and upper crossbars 120, 122 of the center frame member 106 through pins.

Of course, the rack can be designed to be adjustable in length or longer racks could be optionally used, in which case the additional pin hole locations and detent recess location would by incorporated, preferably in the lateral frame members.

In the illustrate embodiment, the cable retractors 68 may be mounted to the center frame member 106. Also, the cable management brackets 72 in the first embodiment may, instead be replaced by incorporating the cable management clips 140 directly into components of the lateral frame members 104.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The invention claimed is:

1. A pedestal for furniture comprising:
   an enclosure with an interior and an opening for accessing the interior, the enclosure including a base, sidewalls and a horizontal partition spaced upward from the base; and
   a rack for electronic equipment located within the interior of the enclosure, the rack being mounted to at least the base so as to be pivotable about a vertical axis between a stowed position in which the rack is entirely within the interior of the enclosure and an access position in which the rack is largely outside the enclosure; and
   wherein a pivotable mounting includes an upper pin mounted to the top panel or an upper end of one of the vertical supports of the rack proximate to a corner of the rack and extends upward from the rack, and a lower pin attached to the bottom panel or a lower end of one of the vertical supports of the rack vertically aligned with the upper pin but extending downward from the rack, the pins engage with corresponding holes in the base and the partition, wherein the pins permit the rack to be pivoted between the stowed position and the access position.

2. The pedestal of claim 1, wherein the rack includes a top panel, a bottom panel and vertical supports that are attached to and connect the top and bottom panels.

3. The pedestal of claim 2, wherein the vertical supports are mounting plates that include a plurality of apertures for use in securing brackets, wiring and electronics to the rack.

4. The pedestal of claim 3, wherein the apertures are configured to interconnect with a tool-less locking mechanism for removable securing components to the mounting plates.

5. The pedestal of claim 1, wherein the upper and lower pins are spring pins which permit each pin to be retracted to release the pin from its corresponding hole or detent, thereby permitting removal of the rack.

6. The pedestal of claim 1, further comprising a locking mechanism for securing the rack to the pedestal in its stowed position.

7. The pedestal of claim 6, wherein the locking mechanism is a detent pin located at or near a front corner of the rack located away from the pivot pins, the detent pin engaging with a detent recess in the base to hold the rack in the stowed position, the detent pin includes a spring for biasing the spring into engagement with the detent in an engaged position.

8. The pedestal of claim 7, wherein the detent pin is lockable in its engaged position.

9. A pedestal for furniture comprising:
   an enclosure with an interior and an opening for accessing the interior, the enclosure including a base, sidewalls and a horizontal partition spaced upward from the base; and
   a rack for electronic equipment located within the interior of the enclosure, the rack being mounted to at least the base so as to be pivotable about a vertical axis between a stowed position in which the rack is entirely within the interior of the enclosure and an access position in which the rack is largely outside the enclosure; and
   wherein the enclosure includes two telescoping slide mechanisms, one attached to a top of the base and the other attached to a bottom of the partition, each telescoping slide mechanism including a fixed base bracket and a movable bracket that slides on the base bracket, wherein a pivotable mounting includes an upper pin mounted to the top panel or an upper end of one of the vertical supports of the rack proximate to a corner of the rack and extends upward from the rack, and a lower pin attached to the bottom panel or a lower end of one of the vertical supports of the rack vertically aligned with the upper pin but extending downward from the rack, and wherein each pin is removably engaged with a hole in a corresponding movable bracket of the slide mechanism, wherein the slide mechanisms telescope so as to permit the rack to slide at least partially out of the interior of the enclosure and the pins permit the rack to be pivoted about the vertical axis to the access position; and
   further comprising cable management brackets mounted to the sidewall of the enclosure.

10. The pedestal of claim 1, wherein the partition includes one or more openings, and wherein the enclosure further comprises one or more cooling fans mounted to the openings and configured to draw air out of or force air into the interior.

11. The pedestal of claim 1, wherein a space above the partition contains a receptacle containing at least one of power and data outlets, accessible from above the pedestal.

12. A pedestal for furniture comprising:
   an enclosure with an interior and an opening for accessing the interior, the enclosure including a base, sidewalls and a horizontal partition spaced upward from the base; and
   a rack for electronic equipment located within the interior of the enclosure, the rack being mounted to at least the base so as to be pivotable about a vertical axis between a stowed position in which the rack is entirely within the interior of the enclosure and an access position in which the rack is largely outside the enclosure; and
   wherein the enclosure of the pedestal is telescopically adjustable in at least one horizontal dimension.

13. The pedestal of claim 12, wherein the base includes a rack support frame located between the rack and the partition, the rack support frame being attached to the sidewalls, the rack support frame including two lateral frame members and a center frame member, each lateral frame member includes a side panel, a back panel, a bottom panel and a front bracket that are affixed to one another, each side panel has a top leg and a bottom leg, the top legs of the side panels are attached to a bottom surface of the partition, the center frame member includes a back panel, a bottom panel, a lower crossbar, and an upper crossbar, wherein portions of the back and bottom panels of the lateral frame members slide behind and under, respectively, portions of the back and bottom panels of the center frame member, thus allowing for the lateral frame members to translate relative to the center frame member, and wherein the lateral front brackets of the lateral frame members include an internal cavity into which the lower crossbar slides so as to permit lateral movement of the lateral frame members.

14. The pedestal of claim 13, wherein a pivotable mounting includes an upper pin mounted to the top panel or an upper end of one of the vertical supports of the rack proximate to a corner of the rack and extends upward from the rack, and a lower pin attached to the bottom panel or a lower end of one of the vertical supports of the rack vertically aligned with the upper pin but extending downward from the rack, the pins engage with corresponding holes in the lower and upper crossbars, wherein the pins permit the rack to be pivoted between the stowed position and the access position.

15. The pedestal of claim 14, wherein the upper and lower pins spring pins which permit each pin to be retracted to release the pin from its corresponding hole or detent, thereby permitting removal of the rack.

16. The pedestal of claim 14, further comprising cable retractors mounted to the center frame member.

17. A table comprising a table with a top supported in whole or in part by a pedestal according to claim 1.

18. The table of claim 17, further comprising a receptacle for at least one of power and data outlets, wherein the receptacle has in its top a door flush with the table top.

19. The pedestal of claim 14, wherein the rack includes a top panel, a bottom panel and vertical supports that are attached to and connect the top and bottom panels, wherein the vertical supports are mounting plates that include a plurality of apertures for use in securing brackets, wiring and electronics to the rack, and wherein the apertures are configured to interconnect with a tool-less locking mechanism for removable securing components to the mounting plates.

* * * * *